United States Patent
Choi

(10) Patent No.: US 6,724,441 B2
(45) Date of Patent: Apr. 20, 2004

(54) TUNING SYSTEM AND METHOD IN BROADCAST SIGNAL RECEIVER

(75) Inventor: Young-ho Choi, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 426 days.

(21) Appl. No.: 09/920,288

(22) Filed: Aug. 2, 2001

(65) Prior Publication Data

US 2002/0033902 A1 Mar. 21, 2002

(30) Foreign Application Priority Data

Sep. 21, 2000 (KR) ........................................ 2000-55478

(51) Int. Cl.$^7$ ............................ H04N 5/50; H04N 5/44; H03D 1/24; H03C 1/52; H04B 1/68
(52) U.S. Cl. ...................... 348/731; 348/732; 348/733; 348/725; 348/723; 375/321; 375/270; 455/48; 455/108; 455/203
(58) Field of Search ................................ 348/731–733, 348/725, 723; 375/321, 270, 295, 296, 301, 346; 455/47–48, 108–109, 203–204; 329/356, 357; 332/170

(56) References Cited

U.S. PATENT DOCUMENTS

| | | | | |
|---|---|---|---|---|
| 3,715,670 A | * | 2/1973 | Hirsch et al. ................ | 375/232 |
| 4,855,835 A | * | 8/1989 | Tobita ........................ | 348/735 |
| 5,142,692 A | * | 8/1992 | Owen .......................... | 455/48 |
| 5,638,407 A | * | 6/1997 | Hatanaka et al. ............. | 375/328 |
| 5,881,107 A | * | 3/1999 | Termerinac et al. ......... | 375/279 |
| 5,894,334 A | * | 4/1999 | Strolle et al. ............... | 348/725 |
| 6,243,567 B1 | * | 6/2001 | Saito ....................... | 455/188.2 |
| 6,343,209 B1 | * | 1/2002 | Maeda et al. ............ | 455/160.1 |
| 6,539,062 B1 | * | 3/2003 | Grabb et al. ................ | 375/261 |
| 6,577,353 B1 | * | 6/2003 | Welles et al. ............... | 348/706 |

FOREIGN PATENT DOCUMENTS

WO    WO 90/16120    * 12/1990

* cited by examiner

*Primary Examiner*—Michael H. Lee
*Assistant Examiner*—Paulos Natnael
(74) *Attorney, Agent, or Firm*—Robert E. Bushnell, Esq.

(57) ABSTRACT

A tuning system and a tuning method in a broadcast signal receiver, in which a radio frequency (RF) spectrum signal adopting an inverting method is filtered by an asymmetric bandpass filter of a tuner to improve the receiving sensitivity. This tuning system includes a first mixer, a filter and a second mixer. The first mixer mixes a predetermined oscillation frequency with an inverted 8 VSB digital broadcast signal in the idle space between upper and lower normal NTSC broadcast signals of high frequency band received from a transmitter, transfers the upper NTSC broadcast signal to the lower side and the lower NTSC broadcast signal to the upper side, inverts the transferred NTSC broadcast signals, and changes the state of the 8 VSB digital broadcast signal into a normal state. The filter attenuates the inverted upper and lower NTSC broadcast signals output from the first mixer to a predetermined band and amplifies the normal 8 VSB digital broadcast signal into a predetermined band. The second mixer mixes a predetermined oscillation frequency with the attenuated NTSC broadcast signals and the amplified 8 VSB digital broadcast signal output from the filter and lowers the frequency of the mixed signal to a predetermined frequency band. Accordingly, an RF spectrum transmission method is changed from a normal method to an inverting method, so that the DTV interference of adjacent NTSC signals is minimized.

6 Claims, 3 Drawing Sheets

FIG. 5
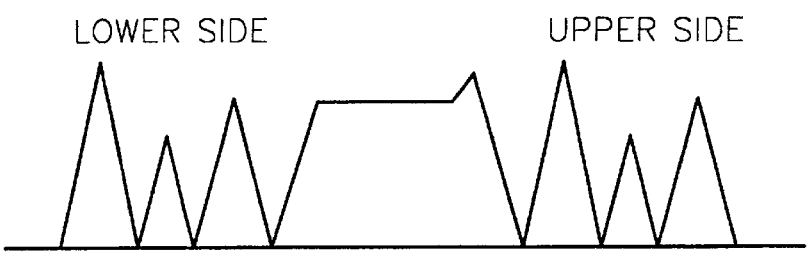
FIG. 5(a)
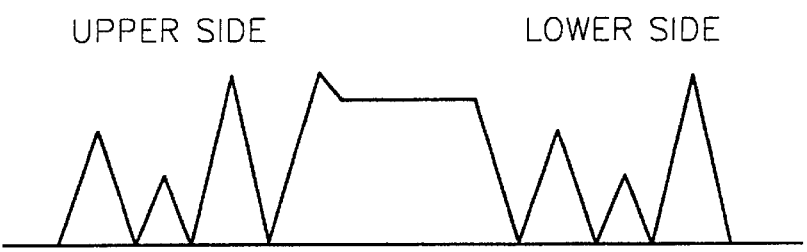
FIG. 5(b)
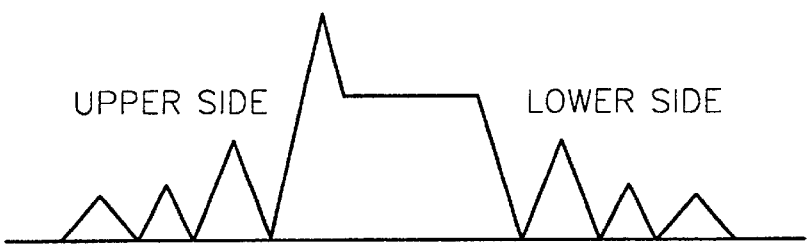
FIG. 5(c)

TUNING SYSTEM AND METHOD IN BROADCAST SIGNAL RECEIVER

CLAIM OF PRIORITY

This application makes reference to, incorporates the same herein, and claims all benefits accruing under 35 U.S.C §119 from an application entitled A System And Method For Tuning Of Broadcasting Signal Receiver earlier filed in the Korean Industrial Property Office on Sept. 21, 2000, and there duly assigned Serial No. 00-55478 by that Office.

BACKGROUND OF THE INVENTION

1. Field of the Invention

The present invention relates to an apparatus and method of receiving broadcast signals, and more particularly, to a tuning system and a tuning method in a broadcast signal receiver, in which a radio frequency (RF) spectrum signal adopting an inverting method is filtered by the asymmetric bandpass filter of a tuner to improve the receiving sensitivity.

2. Description of the Related Art

FIG. 1 is an exemplary RF spectrum diagram of a broadcast signal RF spectrum having a structure in which an 8 VSB (8-level vestigial side band) digital broadcast spectrum signal is located in the empty channel between a lower analog NTSC (National Television System Committee) spectrum (hereinafter, referred to as a lower NTSC spectrum) and an upper analog NTSC spectrum (hereinafter, referred to as an upper NTSC spectrum). Also, as shown in FIG. 1, the audio signal of the lower NTSC spectrum is separated by only 0.56 MHz from a pilot tone of the 8 VSB digital broadcast spectrum.

Upon 8 VSB reception, proper detection of a pilot tone is important for signal recovery by a receiver so that it can determine the performance of a receiving unit. An 8 VSB transmission system transmits data using a single pilot tone instead of multiple pilot tones as upon a coded orthogonal frequency division multiplexing (COFDM) of DVB-T. Thus, damage to the pilot tone on a transmission line may prevent proper reception.

In particular, when an 8 VSB digital broadcast spectrum signal is adjacent to an existing is NTSC spectrum, the audio signal of a lower NTSC spectrum is separated by 0.56 MHz from the pilot tone of the 8 VSB digital broadcast spectrum signal. Accordingly, when the lower NTSC spectrum is very large, a pilot tone on the 8 VSB digital broadcast spectrum may be damaged. Also, since the pilot tone of the 8 VSB digital broadcast spectrum is separated by 1.25 MHz from the luminance signal of an upper NTSC spectrum, the interference of the upper NTSC spectrum signal is usually 3–4 dB lower than the interference of the lower NTSC spectrum signal.

Accordingly, if there are no upper NTSC signals, a transmitting unit usually shifts the frequency of an 8 VSB signal by several tens of kHz toward the upper side in order to minimize the interference of a lower NTSC signal. In this case, a receiving unit captures the shifted frequency by automatic fine tuning (AFT) and thus can achieve accurate tuning. However, the receiving unit does not know how much the frequency is shifted, and thus usually sweeps a frequency of about 1.5 MHz based on the central frequency, resulting in time-consuming automatic fine tuning. In recent digital techniques, it takes several minutes to search for the entire channel during initial auto program execution. An 8 VSB transmission method as shown in FIG. 1 provides poor NTSC adjacent-channel characteristics and prolongs the time for a receiving unit to perform automatic fine tuning.

Difficult audition of 8 VSB signals under indoor circumstances and vulnerability to a variety of multipaths are largely affected by the fact that a tuning system uses a single pilot tone in contrast to COFDM. Distortion of the single pilot tone on a transmission line can bring even a situation where reception is impossible. It is no exaggeration to say that the performance of reception of 8 VSB signals can be greatly affected by how well the pilot tone is detected. For example, when a tuner is made up of a symmetrical band pass filter, damage to a pilot tone on a transmission line may have a fatal effect on the carrier recovery by a VSB chip (not shown) at the rear side.

SUMMARY OF THE INVENTION

To solve the above problem, an objective of the present invention is to provide a tuning system of a broadcast signal receiver, in which an inverting method for an 8 VSB digital broadcast signal is adopted instead of an exemplary normal spectrum method, and an asymmetric bandpass filter in which a low pass portion has a large gain is included in a tuner of a receiving unit, so that the sensitivity of reception of 8 VSB signals is improved.

An objective of the present invention is to provide a tuning method for a broadcast signal receiver, in which an inverting method for an 8 VSB digital broadcast signal is adopted instead of an exemplary normal spectrum method, and an asymmetric bandpass filter in which a low pass portion has a large gain is included in a tuner of a receiving unit, so that the sensitivity of reception of 8 VSB signals is improved.

The first objective of the present invention is achieved by a tuning system including: a first mixer for mixing a predetermined oscillation frequency with an inverted digital broadcast signal in the idle space between normal upper and lower NTSC broadcast signals of a high frequency band received from a transmitter, transferring the upper NTSC broadcast signal to the lower side and the lower NTSC broadcast signal to the upper side, inverting the transferred NTSC broadcast signals, and changing the state of the digital broadcast signal into a normal state; a filter for attenuating the inverted upper and lower NTSC broadcast signals output from the first mixer to a predetermined band and amplifying the normal digital broadcast signal into a predetermined band; and a second mixer for mixing a predetermined oscillation frequency with the attenuated NTSC broadcast signals and the amplified digital broadcast signal output from the filter and lowering the frequency of the mixed signal to a predetermined frequency band.

The second objective of the present invention is achieved by a tuning method including: (a) transmitting an inverted digital broadcast signal in the idle space between normal upper and lower NTSC broadcast signals of a high frequency band; (b) transferring the upper NTSC broadcast signal to the lower side and the lower NTSC broadcast signal to the upper side, inverting the transferred NTSC broadcast signals, and changing the state of the digital broadcast signal into a normal state; and (c) attenuating the inverted upper and lower NTSC broadcast signals to a predetermined band, and amplifying the normal digital broadcast signal into a predetermined band and lowering the frequency of the amplified digital broadcast signal to a predetermined frequency band.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein:

FIGS. 5(a)–5(c) are waveform diagrams for illustrating a tuning method for the tuning system of the broadcast signal receiver of FIG. 4, according to the present invention.

DESCRIPTION OF THE PREFERRED EMBODIMENT

Figure 1:
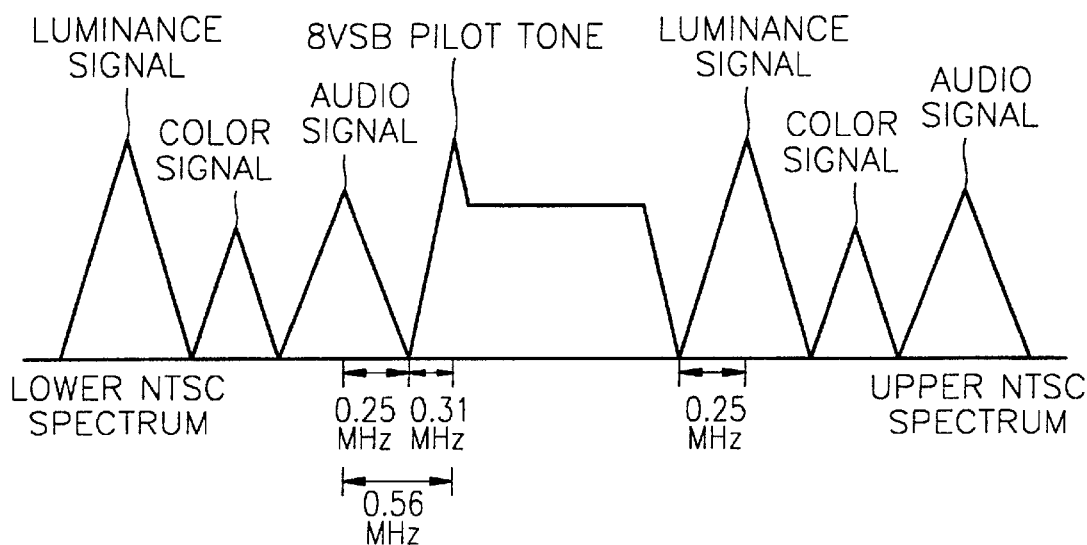
FIG. 1 is an exemplary RF spectrum diagram of a broadcast RF signal having an 8 VSB digital broadcast spectrum signal is located between a lower NTSC spectrum and an upper NTSC spectrum.
Figure 2:
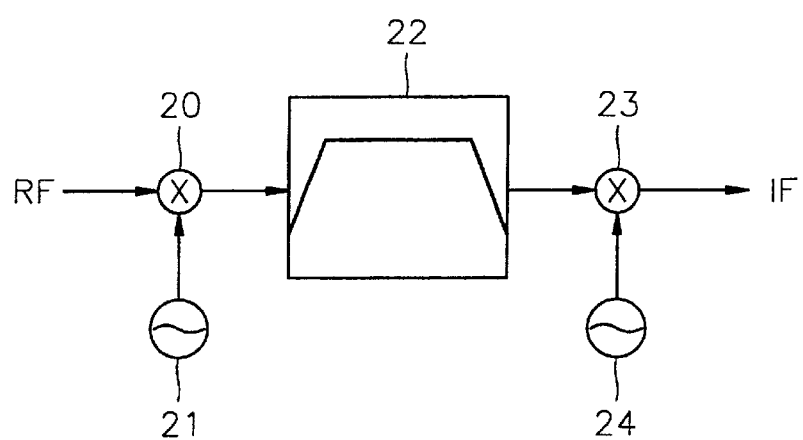
FIG. 2 is a block diagram illustrating the structure of an exemplary 8 VSB double conversion tuner.

FIG. 2 is a block diagram illustrating the structure of an exemplary 8 VSB (8-level vestigial side band) double conversion tuner. As shown in FIG. 2, the 8 VSB double conversion tuner has a symmetrical band pass filter 22 of about 12 MHz interposed between first and second mixers 20 and 23, thus having an improved adjacent-channel removal rate as compared to single conversion tuners.

A double conversion tuner, as shown in FIG. 2, is usually used to reinforce the adjacent-channel characteristics, instead of an analog NTSC single conversion tuner. In the double conversion tuner of FIG. 2, a symmetrical band pass filter 22 is interposed between first and second mixers 20 and 23 to remove an adjacent-channel component. There is a difference in size of 7 dB between the luminance signal and the audio signal in an NTSC spectrum. The luminance signal of an upper NTSC spectrum is separated by 1.25 MHz from the pilot tone of an 8 VSB digital broadcast spectrum, and the audio signal of a lower NTSC spectrum is separated by 0.56 MHz from the pilot tone of the 8 VSB digital broadcast spectrum, thus the audio component of an NTSC greatly affects the adjacent-channel interference. Even though a 47.25 MHz notch filter (not shown) for removing the audio component has recently been installed at an intermediate frequency (IF) port outside the tuner of a receiving unit, a tuner must previously remove the audio component to some extent in order to obtain a very excellent adjacent removal performance. Existing symmetrical wide band pass filters remove a luminance signal and an audio signal by the same size, so that efficient removal of an audio signal cannot be achieved.

Figure 3:
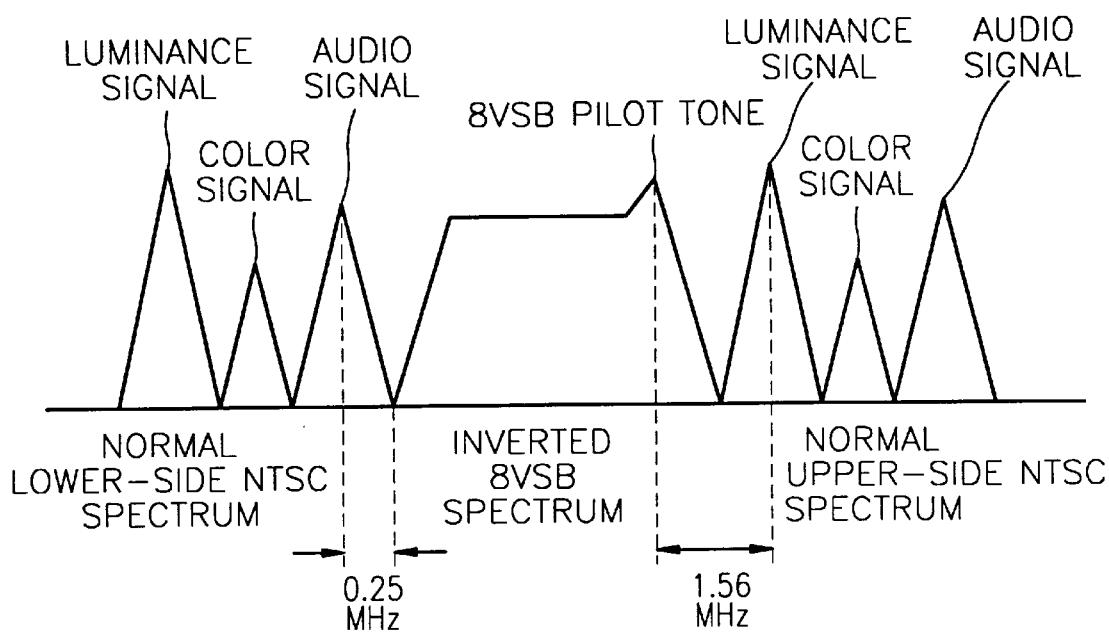
FIG. 3 is an RF spectrum diagram of a broadcast RF signal having an inverted 8 VSB digital broadcast spectrum signal located between a lower NTSC spectrum and an upper NTSC spectrum, according to the present invention.
Figure 4:
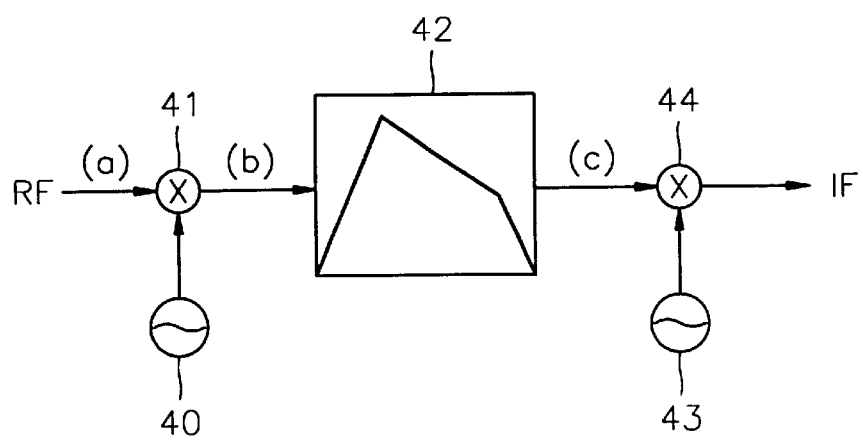
FIG. 4 is a block diagram illustrating the structure of a tuning system in a broadcast signal receiver for processing the broadcast RF signal of FIG. 3, according to the present invention.

FIG. 3 is an RF spectrum diagram of a broadcast RF signal having an inverted 8 VSB digital broadcast spectrum signal located between a normal lower NTSC spectrum and a normal upper NTSC spectrum. The luminance signal of the upper NTSC spectrum is separated by 1.56 MHz from the pilot tone of the 8 VSB digital broadcast spectrum, and the audio signal of the lower NTSC spectrum is separated by 1.25 MHz from the pilot tone of the 8 VSB digital broadcast spectrum FIG. 4 is a block diagram illustrating the structure of a tuning system in a broadcast signal receiver according to the present invention. The tuning system of FIG. 4 includes a first local oscillator 40, a first mixer 41, an asymmetric bandpass filter (BPF) 42, a second local oscillator 43, and a second mixer 44. The first local oscillator 40 outputs a first local oscillating frequency. The first mixer 41 mixes an oscillating frequency from the first local oscillator 40 with the broadcast RF signal having the inverted 8 VSB digital broadcast spectrum signal located in the idle space between the normal lower NTSC spectrum and the normal upper NTSC spectrum received from a transmission unit (not shown). The output of first mixer 41 is and inverted broadcast RF signal.

The asymmetric bandpass filter (BPF) 42 attenuates the inverted upper and lower NTSC broadcast signals output from the first mixer 41 to a predetermined band, and amplifies a normal 8 VSB digital broadcast signal to a predetermined band. The second local oscillator 43 outputs a second local oscillating frequency. The second mixer 44 mixes the attenuated NTSC broadcast signals and the amplified 8 VSB broadcast signal from the asymmetrical BPF 42 with the second local oscillating frequency from the second local oscillator 43 to obtain an intermediate frequency (IF).

FIGS. 5(a)–5(c) are waveform diagrams for illustrating a tuning method for the tuning system of the broadcast signal receiver of FIG. 4.

The present invention will now be described with reference to FIGS. 3 through 5(c). The pilot tone of an 8 VSB digital broadcast spectrum performs a very important function, and thus it is inverted instead of being located adjacent to a lower analog NTSC spectrum, in order to further reinforce the NTSC interference. As shown in FIG. 3, a radio frequency (RF) spectrum according to the present invention has a structure in which an inverted 8 VSB digital broadcast spectrum signal is placed in the idle channel between lower and upper analog NTSC spectrums. As shown in FIG. 3, the luminance signal of the upper NTSC spectrum is separated by 1.56 MHz from the pilot tone of the inverted 8 VSB digital broadcast spectrum, whereby the DTV (digital television) interference of adjacent NTSC signals can be minimized.

An RF spectrum signal (FIG. 3 or FIG. 5(a)) according to the present invention is output from a transmission unit (not shown) and input to the first mixer 41. At this time, the first oscillation signal from the first local oscillator 40 is also input to the first mixer 41. The first mixer 41 mixes the first oscillation signal from the first local oscillator 40 with an inverted digital broadcast signal in the idle space between upper and lower normal NTSC broadcast signals of high frequency band received from a transmission unit (not shown). As shown in FIG. 5(b), the upper NTSC broadcast signal is inverted and transferred to the lower side, and the lower NTSC broadcast signal is inverted and transferred to the upper side. In this state, the first mixer 41 inverts the shifted NTSC broadcast signals and changes the state of the 8 VSB digital broadcast signal into a normal state.

The asymmetrical BPF 42, in which the gain of a high pass portion is somewhat small and the gain of a low pass portion is somewhat large, asymmetrically band-filters the signals output from the first mixer 41. After the upper and lower inverted NTSC broadcast signals and the normal 8 VSB digital broadcast signal output from the first mixer 41 passes through the asymmetrical BPF 42, the pilot tone of the 8 VSB digital broadcast signal is amplified, and the upper and lower NTSC broadcast signals are attenuated, as shown in FIG. 5(c). In particular, the luminance component of the lower NTSC broadcast signal the closest to the pilot tone of the VSB digital broadcast signal is further attenuated. Thus, the pilot tone of the amplified VSB digital broadcast signal enable more efficient carrier wave recovery in a VSB chip (not shown) of a receiving unit, so that more efficient reception is possible under an indoor environment. The attenuated upper and lower NTSC broadcast signals are removed by a surface acoustic wave (SAW) filter (not shown) at the rear side.

The signal of FIG. 5(c) output from the asymmetrical BPF 42 is input to the second mixer 44. At this time, the second oscillation signal of the second local oscillator 43 is also input to the second mixer 44. The second mixer 44 mixes the output signals of the asymmetrical BPF 42 with the second oscillation signal, and lowers the frequency of the high-frequency 8 VSB digital broadcast signal to obtain an IF 8 VSB digital broadcast signal.

Although the invention has been described with reference to a particular embodiment, it will be apparent to one of ordinary skill in the art that modifications of the described embodiment may be made without departing from the spirit and scope of the invention.

According to the present invention as described above, an RF spectrum transmission method is changed from a normal method to an inverting method, so that the DTV interference of adjacent NTSC signals is minimized. Also, a transmission unit does not need to shift the frequency of a DTV signal with respect to adjacent NTSC signals, so that the time for a receiver to perform AFT is shortened. Furthermore, the tuner of a receiver includes an asymmetric bandpass filter which emphasizes a low pass portion, so that the pilot tone of a 8VBS signal is amplified, difficult audition prone to occur under indoor circumstances can be solved, and a receiver capable of enduring a variety of multiple paths and noise can be designed. Finally, the amplification of a pilot tone by a tuner at a receiving end can speed the carrier recovery performed by a VSB chip, so that the channel locking time can be reduced.

What is claimed is:

1. A tuning system comprising:
   a first mixer for mixing a first predetermined oscillation frequency with an inverted 8 level vestigial side band (8 VSB) digital broadcast signal in the idle space between normal upper and lower NTSC (National Television System Committee) broadcast signals of a high frequency band received from a transmitter, transferring the upper NTSC broadcast signal to a lower side of an NTSC spectrum and the lower NTSC broadcast signal to an upper side of said NTSC spectrum, inverting the transferred NTSC broadcast signals, and changing a state of the 8 VSB digital broadcast signal into a normal NTSC spectrum state;
   a filter for attenuating the inverted upper and lower NTSC broadcast signals output from the first mixer to a predetermined band and amplifying the normal 8 VSB digital broadcast signal into the predetermined band; and
   a second mixer for mixing a second predetermined oscillation frequency with the attenuated NTSC broadcast signals and the amplified 8 VSB digital broadcast signal output from the filter and lowering the frequency of the mixed signal to a predetermined frequency band.

2. The tuning system of claim 1, wherein the filter is an asymmetric band pass filter having a gain of a low pass portion that is greater than a gain of a high pass portion.

3. A tuning method comprising:
   transmitting an inverted 8 VSB digital broadcast signal in an idle space of an NTSC (National Television System Committee) spectrum between upper and lower normal NTSC broadcast signals of a high frequency band;
   transferring the upper NTSC broadcast signal to the lower side of said NTSC spectrum;
   transferring the lower NTSC broadcast signal to the upper side of said ntsc spectrum;
   inverting the transferred upper and lower NTSC broadcast signals
   changing the inverted state of the 8 VSB digital broadcast signal into a normal state; and
   attenuating the inverted upper and lower NTSC broadcast signals to a predetermined band;
   amplifying the normal 8 VSB digital broadcast signal into said predetermined band; and
   lowering the frequency of the amplified 8 VSB digital broadcast signal to a predetermined frequency band.

4. The tuning method of claim 3, wherein the attenuating and amplifying steps are performed by an asymmetric band filter in which a gain of a low pass portion is greater than a gain of a high pass portion.

5. A tuning system receiving NTSC (National Television System Committee) broadcast signals of a high frequency band NTSC spectrum including an inverted 8 level vestigial side band (8 VSB) digital broadcast signal in the idle space between normal upper and lower NTSC broadcast signals characterized in that an 8 VSB pilot tone is separated from a center frequency of a luminance signal in said upper NTSC broadcast signal by 1.56 MHz, said tuning system comprising:
   a first mixer for mixing a first predetermined oscillation frequency with said inverted 8 level vestigial side band (8 VSB) digital broadcast signal to changing a state of the 8 VSB digital broadcast signal into a normal NTSC spectrum state, transfer the upper NTSC broadcast signal to a lower side of said NTSC spectrum, transfer and the lower NTSC broadcast signal to an upper side of said NTSC spectrum and invert the transferred upper and lower NTSC broadcast signals;
   a filter for attenuating the inverted upper and lower NTSC broadcast signals output from the first mixer to a predetermined band and amplifying the normal 8 VSB digital broadcast signal into said predetermined band; and
   a second mixer for mixing a second predetermined oscillation frequency with the attenuated NTSC broadcast signals and the amplified 8 VSB digital broadcast signal output from the filter and lowering the frequency of the mixed signal to a predetermined frequency band.

6. The tuning system of claim 5, wherein the filter is an asymmetric band pass filter having a gain of a low pass portion that is greater than a gain of a high pass portion.

* * * * *